(12) United States Patent
Sawada et al.

(10) Patent No.: US 9,306,445 B2
(45) Date of Patent: Apr. 5, 2016

(54) POWER CONVERSION APPARATUS

(71) Applicant: DENSO CORPORATION, Kariya, Aichi-pref. (JP)

(72) Inventors: Hiroyoshi Sawada, Nagoya (JP); Makoto Okamura, Nisshin (JP)

(73) Assignee: DENSO CORPORATION, Kariya (JP)

( * ) Notice: Subject to any disclaimer, the term of this patent is extended or adjusted under 35 U.S.C. 154(b) by 476 days.

(21) Appl. No.: 13/845,615

(22) Filed: Mar. 18, 2013

(65) Prior Publication Data

US 2013/0264891 A1 Oct. 10, 2013

(30) Foreign Application Priority Data

Apr. 6, 2012 (JP) .................................. 2012-087362

(51) Int. Cl.
| | | |
|---|---|---|
| H02M 1/14 | (2006.01) | |
| H02M 3/00 | (2006.01) | |
| B60L 11/18 | (2006.01) | |
| H05K 7/14 | (2006.01) | |

(52) U.S. Cl.
CPC ........... *H02M 1/143* (2013.01); *B60L 11/1803* (2013.01); *H02M 3/00* (2013.01); *H05K 7/1432* (2013.01); *B60L 2210/10* (2013.01); *B60L 2270/147* (2013.01); *Y02T 10/7005* (2013.01); *Y02T 10/7216* (2013.01)

(58) Field of Classification Search
CPC .......... H02M 1/143; H02M 3/00; H05K 7/02; H05K 7/1432; B60L 11/1803
See application file for complete search history.

(56) References Cited

U.S. PATENT DOCUMENTS

| | | | | |
|---|---|---|---|---|
| 6,160,696 A | * | 12/2000 | Bailey et al. ................... | 361/115 |
| 2009/0231811 A1 | * | 9/2009 | Tokuyama et al. ........... | 361/699 |
| 2010/0026090 A1 | * | 2/2010 | Nakatsu et al. ................ | 307/9.1 |
| 2010/0327949 A1 | * | 12/2010 | Gotou ........................... | 327/487 |

FOREIGN PATENT DOCUMENTS

| | | |
|---|---|---|
| JP | 2005-012940 | 1/2005 |
| JP | 2006-295997 | 10/2006 |
| JP | 2009-219270 | 9/2009 |
| JP | 2010-35345 | 2/2010 |
| JP | 2011-10496 | 1/2011 |

OTHER PUBLICATIONS

Office Action (2 pgs.) dated Jan. 28, 2014 issued in corresponding Japanese Application No. 2012-087362 with an at least partial English-language translation thereof (2 pgs.).
Information Offer Form (5 pages) dated Apr. 3, 2014, issued in corresponding Japanese Application No. 2012-087362 with English language translation (5 pages).
Office Action (2 pgs.) dated Oct. 7, 2014 issued in corresponding Japanese Application No. 2012-087362 (2 pgs.).

* cited by examiner

*Primary Examiner* — Zeev V Kitov

(74) *Attorney, Agent, or Firm* — Nixon & Vanderhye P.C.

(57) ABSTRACT

The power conversion apparatus includes a power module constituting a switching circuit, a capacitor electrically connected to the power module, and a pair of DC bus bars for transferring electric power to and from the pair of the DC bus bars. The pair of the DC bus bars includes a bus bar extension section which is located along a surface of the capacitor at least at part of a portion thereof constituting a current path between the power module and the capacitor.

7 Claims, 14 Drawing Sheets

POWER CONVERSION APPARATUS

This application claims priority to Japanese Patent Application No. 2012-87362 filed on Apr. 6, 2012, the entire contents of which are hereby incorporated by reference.

BACKGROUND OF THE INVENTION

1. Field of the Invention

The present invention relates to a power conversion apparatus including a power module and a capacitor.

2. Description of Related Art

Electric vehicles and hybrid vehicles are provided with a power conversion apparatus which operates to convert DC power supplied from a battery to AC power for driving a motor mounted thereon. The power conversion is carried out by controlling switching on/off of switching elements of a power module included in the power conversion apparatus. Meanwhile, a surge voltage occurs in such a power conversion apparatus when the switching elements are turned on and off due to inductance arising from the wiring of its internal circuit. Accordingly, it is necessary to reduce such inductance.

Japanese Patent Application Laid-open No. 2010-35345 describes a power conversion apparatus devised to reduce such inductance. This power conversion apparatus has the structure in which a power module and a capacitor are connected to each other through a wiring board including a pair of conductor plates laminated on each other through an insulating sheet. The directions of currents flowing respectively through the conductor plates are opposite to each other. Accordingly, the inductance due to the conductor plates is small.

However, since the inductance due to a current path in the capacitor and a current path in the bus bar drawn from the electrodes of the capacitor cannot be reduced by such a structure, it is difficult to expect sufficient reduction of the surge voltage in the power conversion apparatus described in the above patent document.

SUMMARY

An exemplary embodiment provides a power conversion apparatus including:
- a power module constituting a switching circuit;
- a capacitor electrically connected to the power module; and
- a pair of DC bus bars for transferring electric power to and from the pair of the DC bus bars,
- wherein the pair of the DC bus bars includes a bus bar extension section which is located along a surface of the capacitor at least at part of a portion thereof constituting a current path between the power module and the capacitor.

According to the exemplary embodiment, there is provided a power conversion apparatus devised to sufficiently reduce the inductance due to its current paths.

Other advantages and features of the invention will become apparent from the following description including the drawings and claims.

BRIEF DESCRIPTION OF THE DRAWINGS

In the accompanying drawings.

PREFERRED EMBODIMENTS OF THE INVENTION

Figure 1:
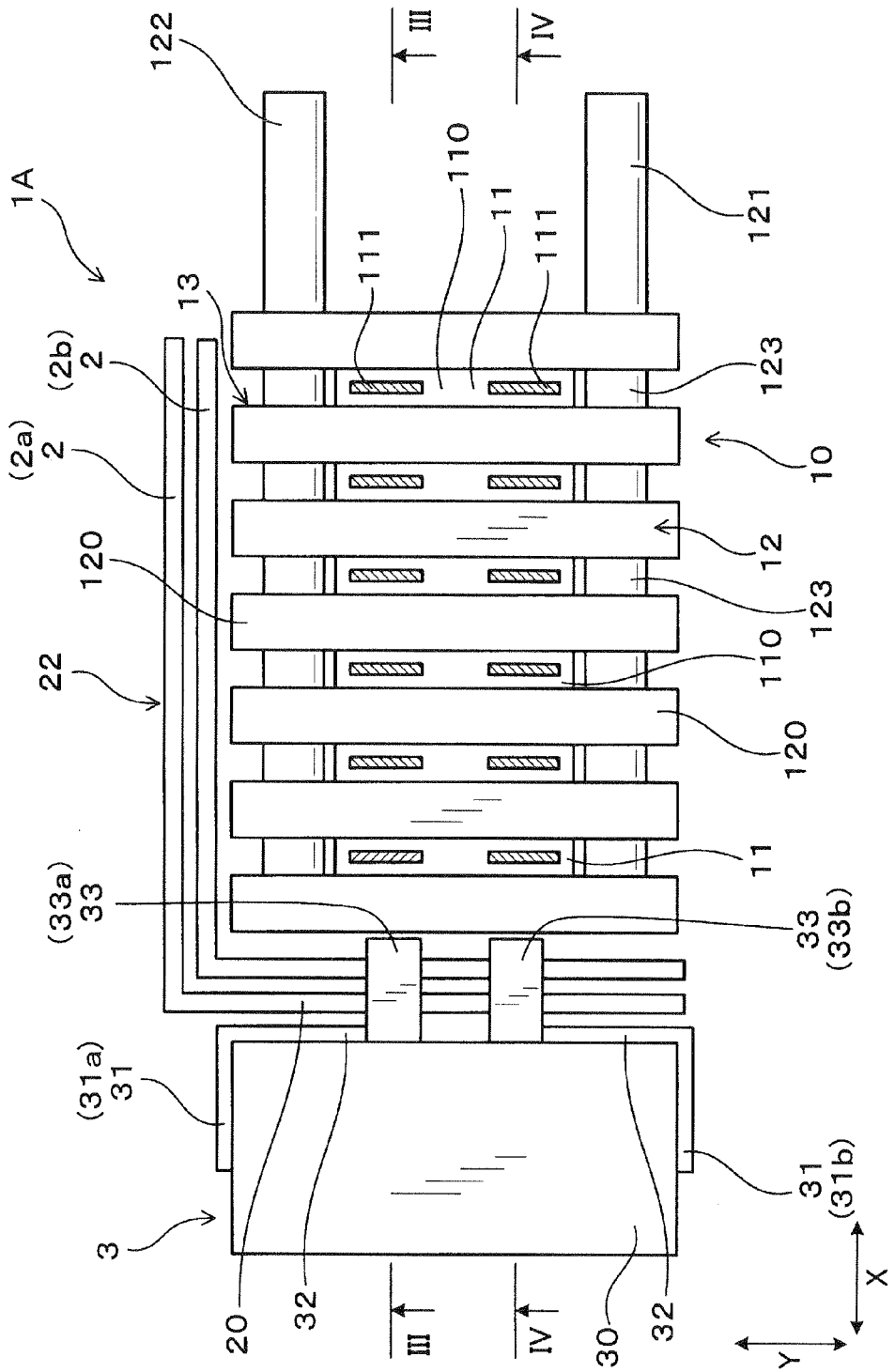
FIG. 1 is plan view of a power conversion apparatus according to a first embodiment of the invention.

In the following embodiments of the invention, the same or equivalent components are indicated by the same reference numerals or characters.

First Embodiment

A power conversion apparatus 1A according to a first embodiment of the invention is described with reference to FIGS. 1 to 5. As shown in FIG. 1, the power conversion apparatus 1A includes a power module 10 as a switching circuit, a capacitor 3 electrically connected to the power module 10 and a pair of DC bus bars 2a and 2b (may be collectively referred to as the DC bus bar 2 hereinafter) for transferring electric power to and from the power module 10. The bus bar 2 includes a bus bar extension section 20 disposed so as to extend along a surface of the capacitor 3 at least at its portion constituting a current path between the power module 10 and the capacitor 3.

The power module 10 and the capacitor 3 are arranged side-by-side. Here, the direction along which the power module 10 and the capacitor 3 are arranged is referred to as the "arranging direction X". Between the power module 10 and the capacitor 3, the bus bar extension section 20 and a later-described capacitor extension section 32 are disposed.

The bus bar 2 is formed by stacking a pair of plate bar-like conductors through an insulator (not shown). As shown in FIG. 1, the DC bus bar 2 is bent at right angle at its approximately center into first and second parts. The first part is located alongside the power module 10 in the direction perpendicular to the arranging direction X. This direction is referred to as the "width direction Y" hereinafter. The second part is located between the power module 10 and the capacitor 3.

The first part of the DC bus bar 2 whose longitudinal direction is parallel to the arranging direction X is connected to one end in the width direction Y of the second part. The first part of the DC bus bar 2 includes a power module connecting portion 22 electrically connected with main electrode terminals 111 of each of later-described semiconductor modules 11. A wiring section for connection between the main electrode terminals 111 and the power module connecting portion 22 is omitted from illustration.

The second part of the DC bus bar 2 located between the power module 10 and the capacitor 3 is disposed such that the thickness direction thereof is parallel to the arranging direction X, and the longitudinal direction thereof is parallel to the width direction Y. One end in the longitudinal direction (width direction Y) of the second part of the DC bus bar 2 is connected to one end of the first part, and the other end in the longitudinal direction of the second part is connected to a DC power supply (not shown).

Figure 2:
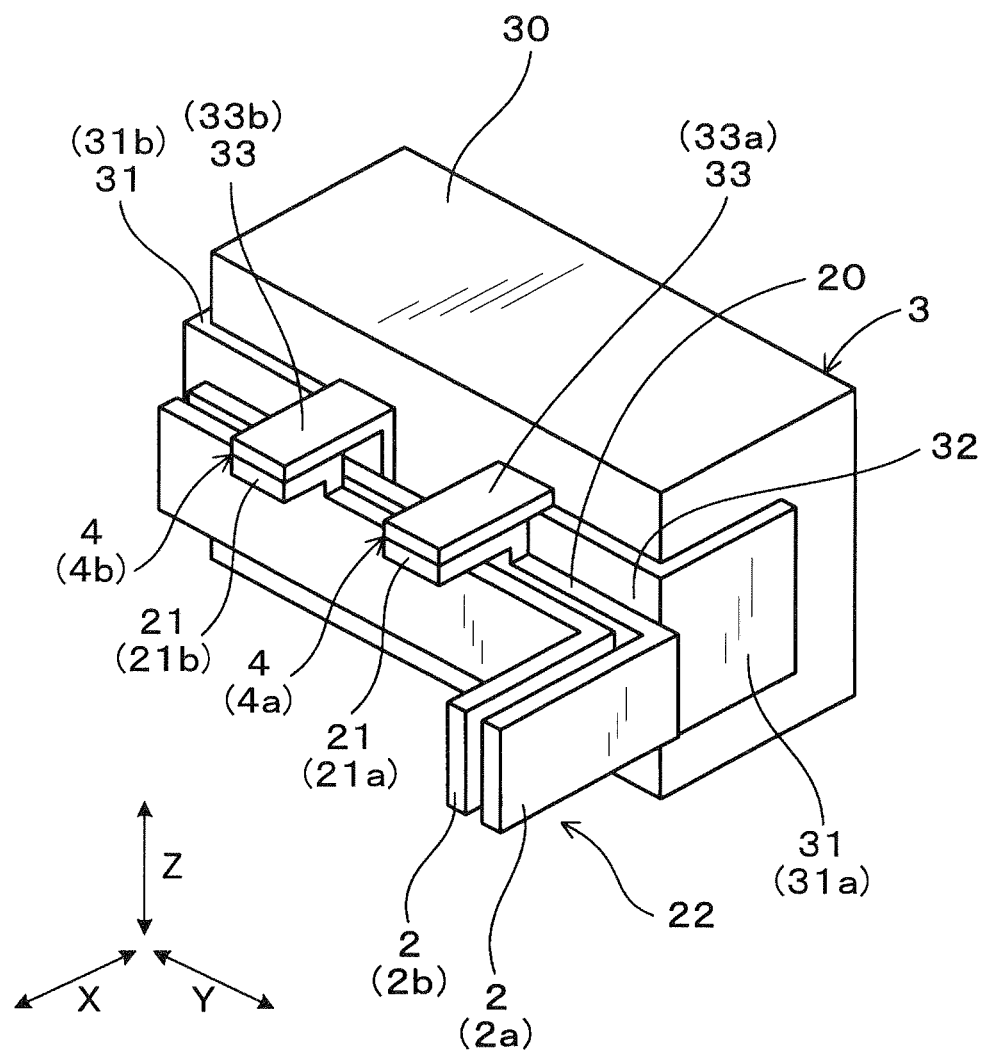
FIG. 2 is a perspective view showing a pair of connecting portions and their vicinity of the power conversion apparatus according to the first embodiment of the invention.

As shown in FIG. 2, the second part of the DC bus bar 2 is provided with a pair of bus bar terminals 21a and 21b (may be collectively referred to as the bus bar terminal 21 hereinafter). The bus bar terminal 21 projects in a height direction Z perpendicular to both the arranging direction X and the width direction Y at an approximately center in the width direction of the second part of the DC bus bar 2.

Figure 3:
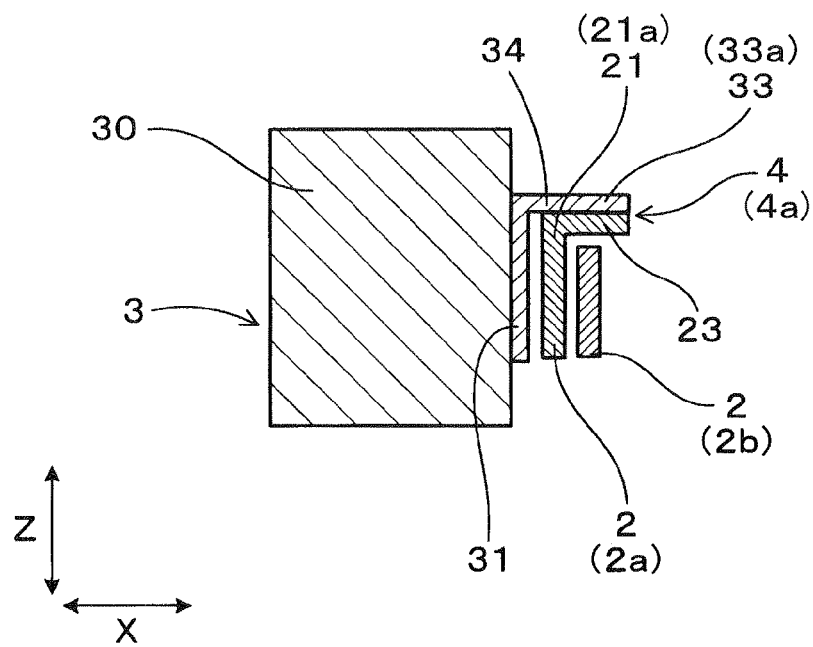
FIG. 3 is a cross-sectional view of FIG. 1 taken along line III-III.
Figure 4:
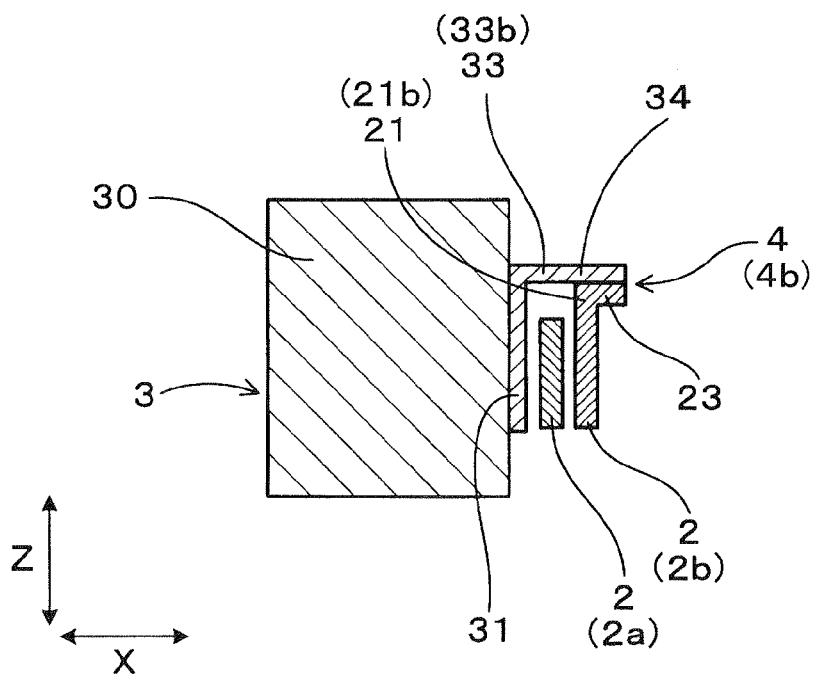
FIG. 4 is a cross-sectional view of FIG. 1 taken along line IV-IV.

The bus bar terminal 21 is formed by causing a middle portion in the width direction Y of the DC bus bar 2 to project in the height direction Z, and bending the end of the resultant projected portion in the arranging direction X to thereby form an end portion 23 extending toward the power module 10. As shown in FIGS. 3 and 4, the end portions 23 of the pair of the bus bar terminals 21A and 21B are connected to a pair of capacitor terminals 33 described later.

A part of a portion of the DC bus bar 2 constituting a current path between the power module 10 and the capacitor 3 constitutes the bus bar extension section 20. That is, the bus bar extension section 20 is constituted by a portion of the DC bus bar 2, which is between the power module connecting portion 22 and the bus bar terminal 21, and located adjacent to the capacitor 30.

As shown in FIG. 2, the capacitor 3 is constituted of a capacitor body 30 having a rectangular shape, and a pair of capacitor bus bars 31a and 31b (may be collectively referred to as the bus bar 31) extending along the capacitor body 30. The capacitor body 30 is formed with a capacitor electrode (not shown) at each of its two surfaces facing the width direction Y. The capacitor electrodes are connected respectively to the capacitor bus bars 31a and 31b.

The capacitor bus bar 31 is a plate bar-shaped conductor extending in the arranging direction X from the capacitor electrodes toward the power module 10. The capacitor bus bar 31 is bent to the Y direction along the capacitor body 30 toward the bus bar terminal 21. This bent portion constitutes the capacitor extension section 32. The capacitor extension section 32 is located between the capacitor body 30 and the bus bar extension section 20.

As shown in FIG. 2, the two capacitor bus bars 31a and 31b are formed with capacitor terminals 33a and 33b projecting in the height direction Z, respectively. Hereinafter, the capacitor terminals 33a and 33b are collectively referred to as the capacitor terminal 33. As shown in FIGS. 2, 3 and 4, the capacitor terminal 33 is formed by causing the end portion of the capacitor bus bar 31 to project in the height direction Z, and bending the resultant projected portion in the arranging direction X toward the power module 10.

As shown in FIGS. 3 and 4, an end portion 34 of the capacitor terminal 33 extending in the arranging direction X and the end portion 23 of the capacitor terminal 33 are stacked on each other in their thickness direction (the height direction Z). The capacitor terminal 33 and the bus bar terminal 21 are connected to each other at their end portions 23 and 34 to form a pair connecting portions 4a and 4b. Hereinafter, the pair of the connecting portions 4a and 4b may be collectively referred to as the connecting portion 4.

Figure 5:
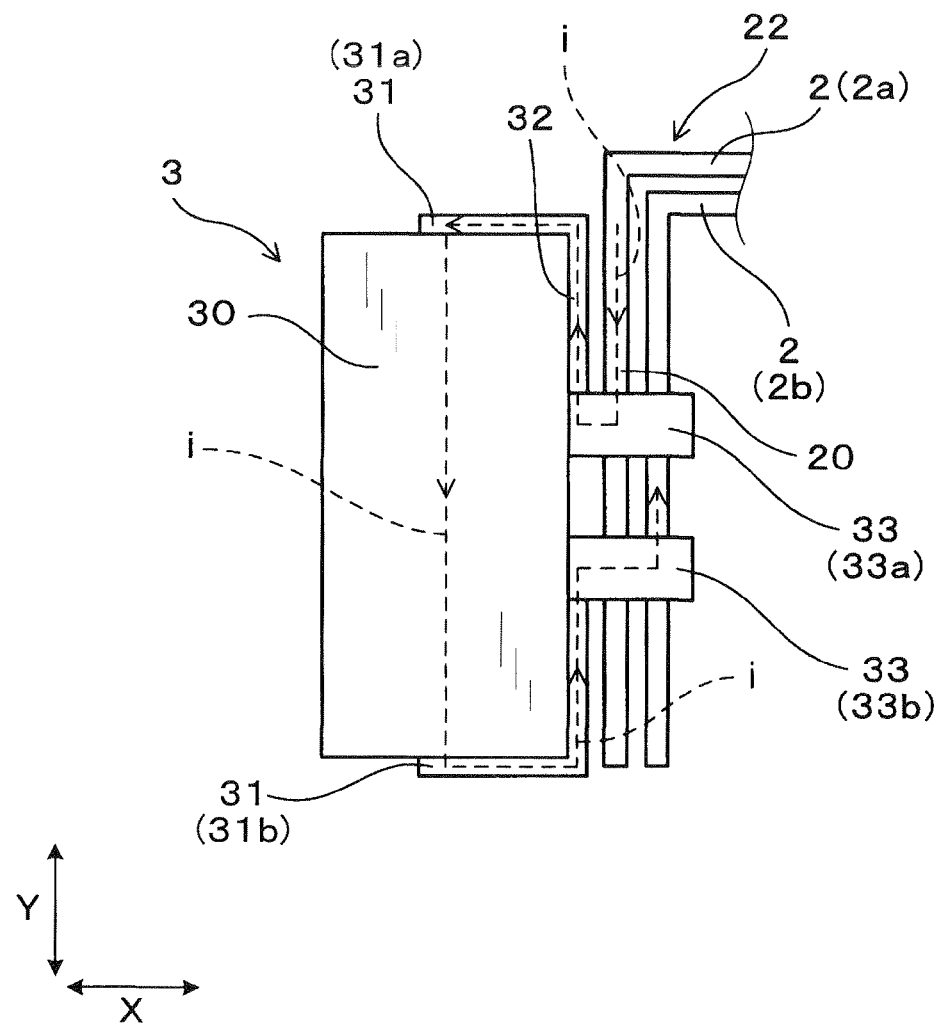
FIG. 5 is a plan view showing current paths of a current flowing through a capacitor and a current flowing through a bus bar extension section of the power conversion apparatus according to the first embodiment of the invention.

Next, current paths of a current i flowing between the power module 10 and the capacitor 3 are explained with reference to FIG. 5. In this embodiment, a current path of the current i in the capacitor body 30, a current path of the current i in the capacitor extension section 32, and a current path of the current i in the bus bar extension section are aligned side-by-side along the arranging direction X.

As shown in FIGS. 3 and 4, the capacitor terminal 33a closer to the power module connecting portion 22 is connected to the DC bus bar 2a, and the capacitor terminal 33b more distant from the power module connecting portion 22 is connected to the DC bus bar 2b. Accordingly, as shown in FIG. 5, when the current flows from the DC bus bar 2a to the DC bus bar 2b, the directions of the current i in each adjacent two of the current paths are opposite to each other. Also, when the current flows from the DC bus bar 2b to the DC bus bar 2a, the flow directions of the current i in each adjacent two of the current paths are opposite to each other.

As shown in FIG. 1, the power module 10 includes a plurality of the semiconductor modules 11 each incorporating a switching element such as an I=element, and a cooler 12 for cooling the semiconductor modules 11. Each semiconductor module 11 includes a mold section 110 having a rectangle-like shape, and a pair of main electrode terminals 111 and a plurality of control terminals (not shown) projecting in the height direction Z from its opposite surfaces, respectively. The semiconductor modules 11 are stacked in the arranging direction X to form a stacked body 13 together with a later-described cooling tube 120 disposed between each adjacent two of the semiconductor modules 11.

The mold section 110 seals therein the switching element by a mold resin thereinside. The main electrode terminals 111 are arranged along the width direction Y, and are connected to the power module connecting portion 22 of the DC bus bar 2.

The cooler 12 is constituted of a coolant inlet tube 121, a coolant outlet tube 122, the cooling tubes 120 and coupling tubes 123 for coupling the cooling tubes 120 to one another. The cooling tube 120 has a shape elongated in the width direction Y. As shown in FIG. 1, the cooler 12 has the structure in which the cooling tubes 12 are arranged along the arranging direction X, and each adjacent two of the cooling tubes 12 are coupled to each other through the coupling tubes 123 at their ends in the longitudinal direction (the width direction Y). The cooler 12 is configured to be able to hold the mold section 110 of the semiconductor module 11 between each adjacent two of the cooling tubes 120, so that the semiconductor modules 11 can be arranged along the arranging direction X.

As shown in FIG. 1, the coolant inlet tube 121 and the coolant outlet tube 122 are disposed extending in the arranging direction X from the cooling tube 120 which is most distant from the capacitor 13. The coolant inlet tube 121 and the coolant outlet tube 122 extend from both ends in the width direction Y of the coolant tube 120 most distant from the capacitor 13.

Accordingly, when coolant is introduced from the coolant inlet tube 121, the coolant passes through the coupling tubes 123 to be distributed to the respective cooling tubes 120 while flowing in the longitudinal direction (the width direction Y). The coolant exchanges heat with the semiconductor modules 11 while flowing through the cooling tubes 120. The coolant whose temperature has increased as a result of the heat exchange passes through the coupling tubes 123 on the downstream side and is discharged from the coolant outlet tube 122. The coolant 12 removes the heat generated from the semiconductor modules 11 in the above described way.

Next, advantages provided by the above described first embodiment are explained. As shown in FIG. 1, the DC bus bar 2 includes the bus bar extension section 20 disposed so as to extend along the surface of the capacitor 3 at least at its portion constituting a current path between the power module 10 and the capacitor 3. Accordingly, the current path in the capacitor 3 can be made close to the current path between the capacitor 3 and the power module 10. As a result, the inductance due to interaction between these current paths can be reduced.

As shown in FIG. 1, the capacitor bus bar 31 of the capacitor 3 includes the capacitor extension section 32 disposed along the surface of the capacitor body 30 between the capacitor body 30 and the bus bar extension section 20. As shown in FIG. 5, the bus bar extension section 20 and the capacitor extension section 32 are disposed such that the directions of the currents flowing through them respectively are opposite to each other. Further, the current path in the capacitor body 30, the current path in the capacitor extension section 32 and the current path in the bus bar extension section 20 are located side-by-side. Accordingly, since the directions of the currents flowing through each adjacent two of these current paths are opposite to each other, the inductance due to interaction among these current paths can be reduced.

As shown in FIGS. 3 and 4, the bus bar terminal 21 and the capacitor terminal 33 are connected to each other in the state of their facing the same direction (the arranging direction X). Accordingly, since the directions of the current flowing through the bus bar terminal 21 and the current flowing through the capacitor terminal 33 are opposite to each other, the inductance arising from the connecting portion 4 can be reduced.

As shown in FIG. 1, the bus bar extension section 20 and the capacitor extension section 32 are located between the capacitor body 30 and the power module 10, so that the space between the capacitor 30 and the power module 10 can be used to accommodate the bus bar extension section 20 and the capacitor extension section 32. Hence, the dead space of the power conversion apparatus 1A can be reduced, and accordingly the power conversion apparatus 1A can be made small compact in size.

As described above, according to the first embodiment, there is provided the power conversion apparatus whose inductance due to its current paths is small.

Second Embodiment

Figure 6:
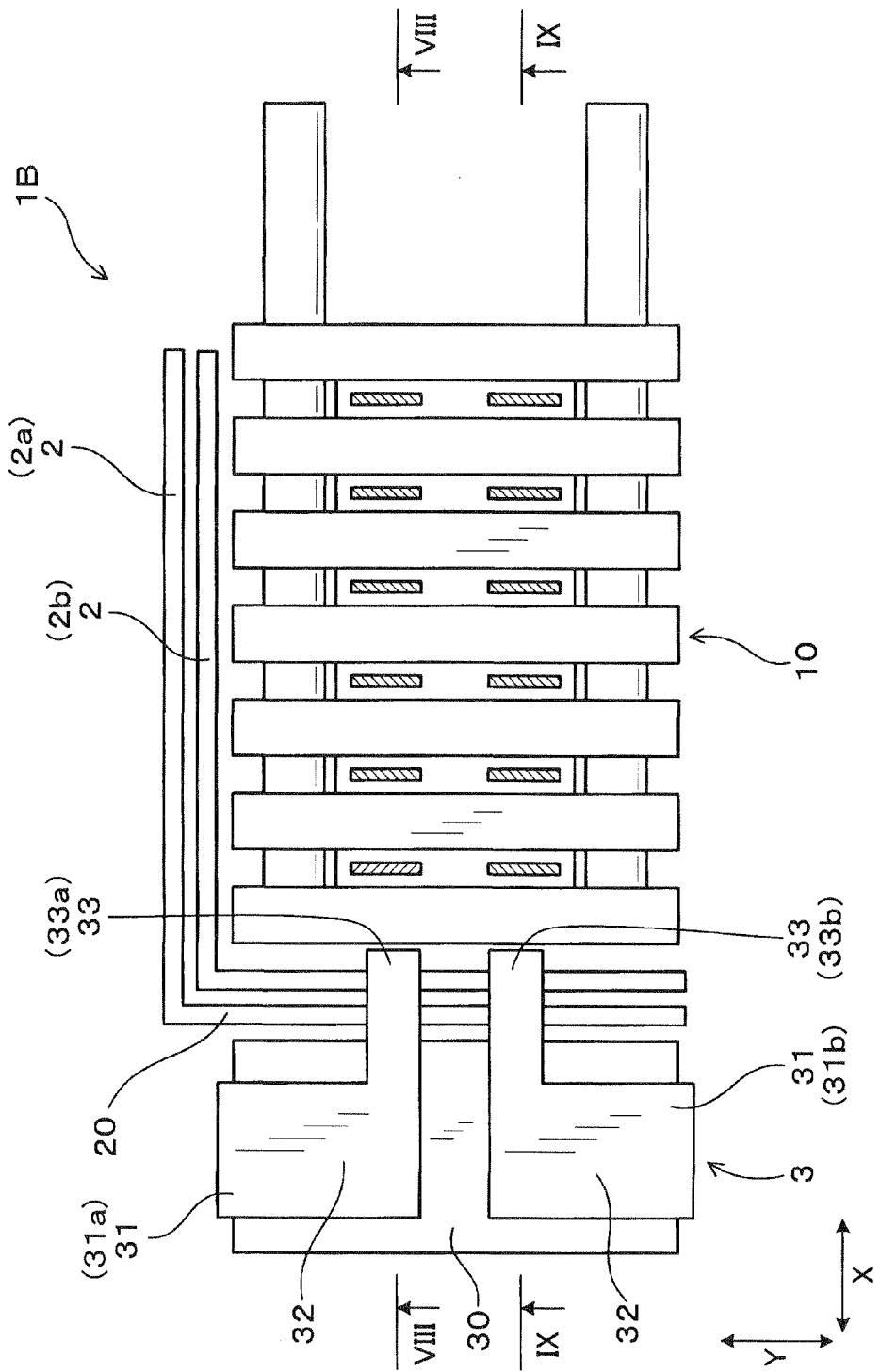
FIG. 6 is a plan view of a power conversion apparatus according to a second embodiment of the invention.
Figure 7:
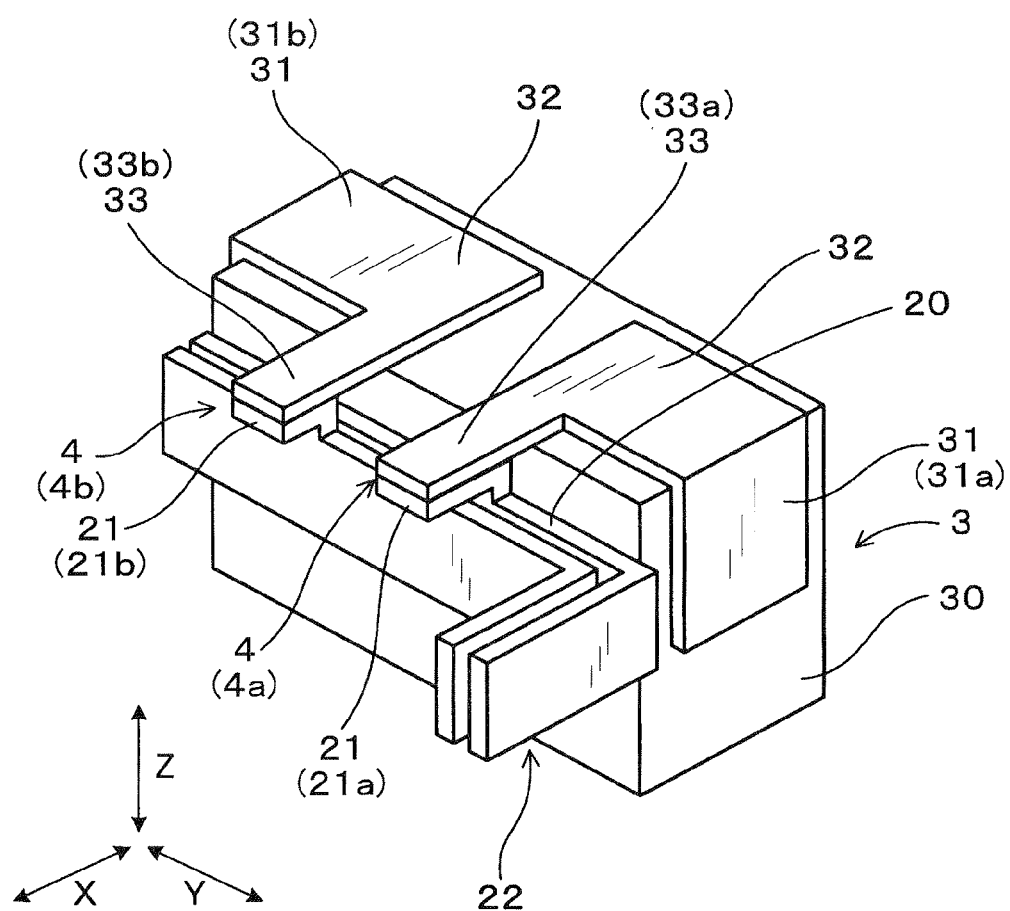
FIG. 7 is a perspective view showing a pair of connecting portions and their vicinity of the power conversion apparatus according to the second embodiment of the invention.

Next, a power conversion apparatus 1B according to a second embodiment of the invention is described. The second embodiment differs from the first embodiment in that the bus bar extension section 20 and the capacitor extension section 32 are disposed along different surfaces of the capacitor body 30, respectively. The power conversion apparatus 1B of the second embodiment has a structure in which the capacitor bus bar 31 extends in the height direction Z from the capacitor electrodes of the capacitor body 30 as shown in FIG. 7, and is bent to the width direction Y along the capacitor body 30 as shown in FIGS. 6 and 7. This bent portion constitutes the capacitor extension section 32. That is, in the second embodiment, the capacitor extension section 32 is located adjacent to the capacitor body 30 in the height direction Z.

Figure 8:
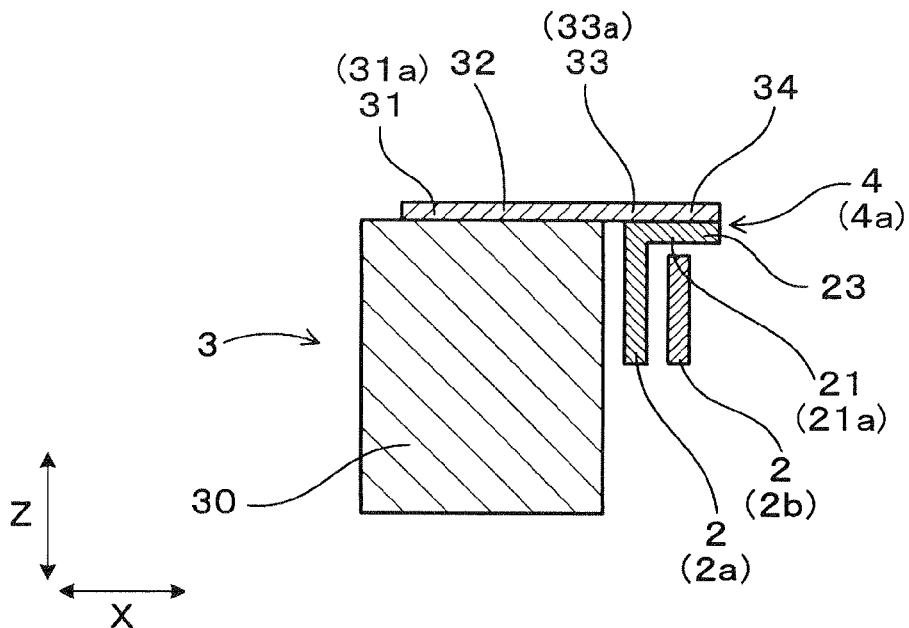
FIG. 8 is a cross-sectional view of FIG. 6 taken along line VIII-VIII.
Figure 9:
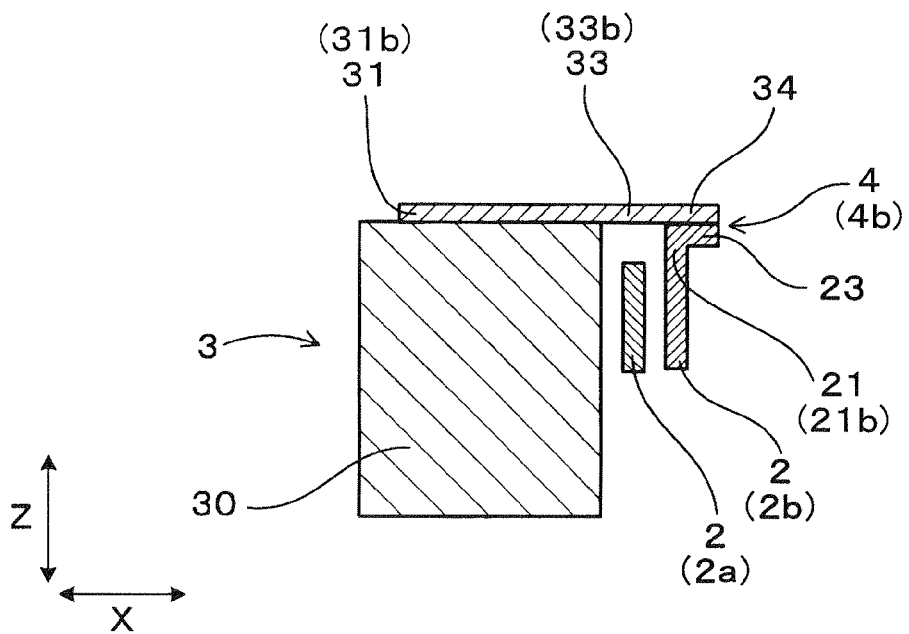
FIG. 9 is a cross-sectional view of FIG. 6 taken along line IX-IX.

The end in the width direction Y of the capacitor extension section 32 is extended in the arranging direction X toward the power module 10 to form the capacitor terminal 33 (the pair of the capacitor terminals 33a and 33b). As shown in FIGS. 8 and 9, the end portion 34 of the capacitor terminal 33 formed so as to face the arranging direction X and the end portion 23 of the bus bar terminal 21 are stacked on each other in the height direction Z to form the connecting portion 4.

Figure 10:
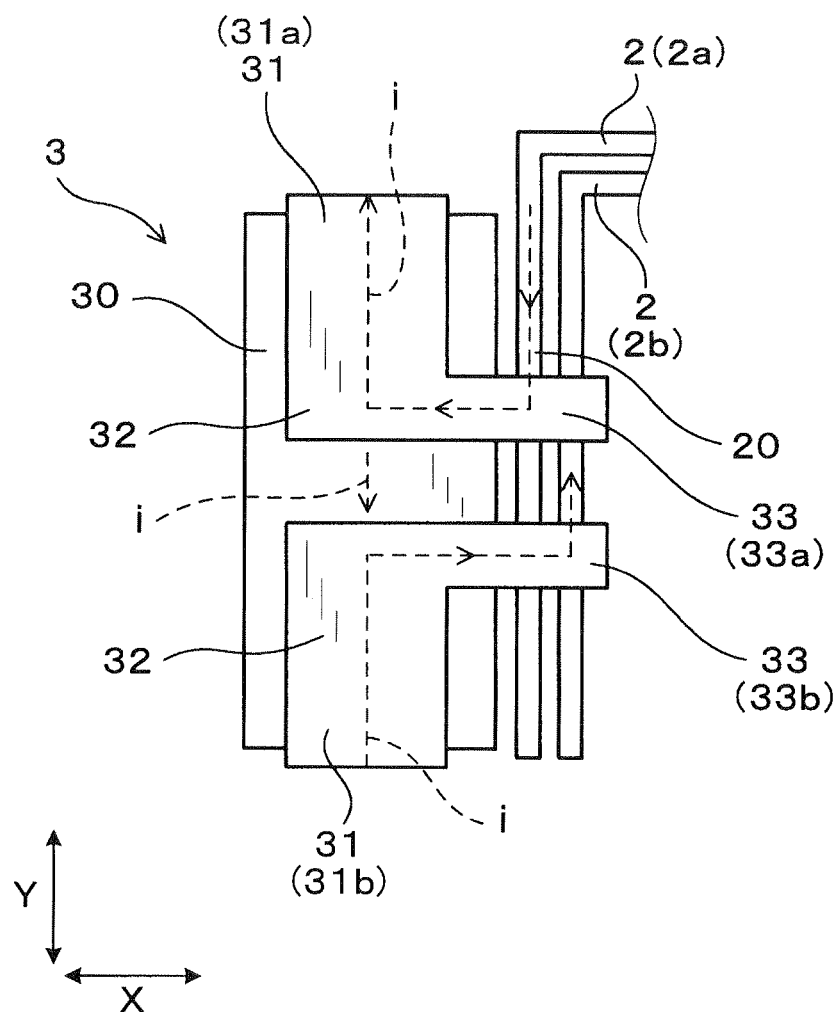
FIG. 10 is a plan view showing current paths of a current flowing through a capacitor and a current flowing through a bus bar extension section of the power conversion apparatus according to the second embodiment of the invention.

As shown in FIG. 10, the power conversion apparatus 1B of the second embodiment is configured such that the current path in the bus bar extension section 20 and the current path in the capacitor body 30 are arranged side-by-side along the arranging direction X, and the direction of the current flowing through the bus bar extension section 20 and the direction of the current flowing through the capacitor body 30 are opposite to each other.

On the other hand, the current path in the capacitor extension section 32 and the current path in the capacitor body 30 are adjacent to each other in the height direction Z. The directions of the current flowing through the capacitor extension section 32 and the current flowing through the capacitor body 30 are opposite to each other.

Except for the above, the second embodiment has the same structure as the first embodiment.

The second embodiment described above provides the following advantages. In the second embodiment, as shown in FIGS. 6 and 10, the bus bar extension section 20 is located adjacent to the capacitor body 30, and the direction of the current flowing through the bus bar extension section 20 and the direction of the current flowing through the capacitor body 30 are opposite to each other. Also, the direction of the current flowing through the capacitor body 30 and the direction of the current flowing through the capacitor extension section 32 are opposite to each other. Accordingly, since the directions of the currents flowing through each adjacent two of the capacitor body 30, bus bar extension section 20 and the capacitor extension section 32 are opposite to each other, the inductance due to the current paths can be reduced.

As shown in FIG. 6, the bus bar extension section 20 is located between the capacitor 3 and the power module 10. Accordingly, the dead space of the power conversion apparatus 1B can be reduced, and accordingly the power conversion apparatus 1B can be made compact in size. The second embodiment provides, in addition to the above described advantages, the same advantages as the first embodiment.

Third Embodiment

Figure 11:
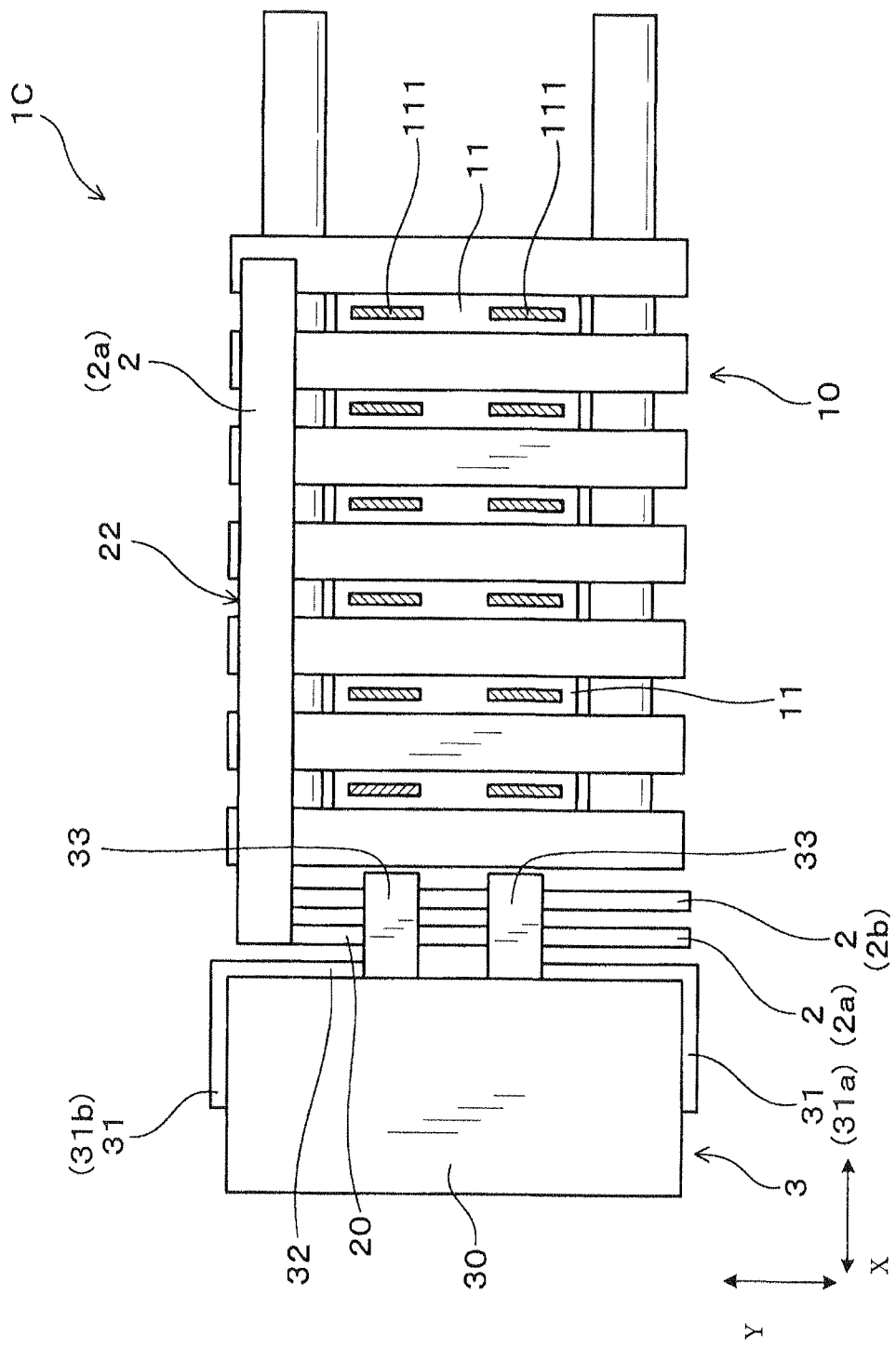
FIG. 11 is a plan view of showing a pair of connecting portions and their vicinity of a power conversion apparatus according to a third embodiment of the invention.

Next, a power conversion apparatus 1C according to a third embodiment of the invention is described. The third embodiment differs from the first embodiment in the location of the module connecting portion 22 of the DC bus bar 2. As shown in FIG. 11, in the third embodiment, the power module connecting portion 22 is located on the side of one end in the width direction Y of the power module 10 so as to overlap with the power module 10 when viewed from the height direction Z.

Figure 12:
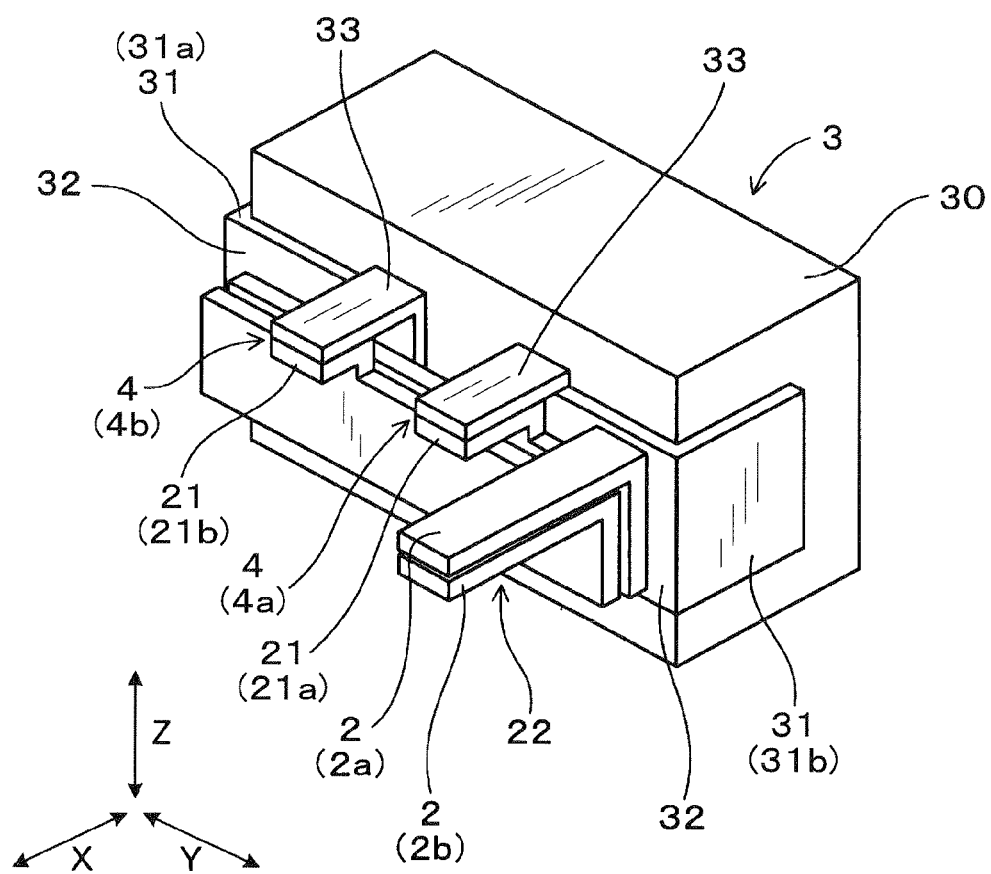
FIG. 12 is a perspective view showing a pair of connecting portions and their vicinity of the power conversion apparatus according to the third embodiment of the invention.

As shown in FIG. 12, the first part of the DC bus bar 2, which includes the power module connecting portion 22, is disposed with its thickness direction facing the height direction Z, and is bent to the height direction Z between the power module 10 and the capacitor 3. The first part of the DC bus bar 2 is connected to the end in the longitudinal direction (the width direction Y) of the second part of the bus bar 2, which is located between the power module 10 and the capacitor 3. Except for the above, the third embodiment has the same structure as the first embodiment.

As understood from the above, the position of the power module connecting portion 22 of the DC bus bar 2 is not limited to any specific position. For example, the power module connecting portion 22 may be located so as to extend between the two main electrode terminals 111 of each semiconductor module 11. By locating the power module connecting portion 22 so as to overlap with the power module 10 when viewed from the height direction Z as in this embodiment, the dimension of the power conversion apparatus 1C in the width direction Y can be reduced easily.

Fourth Embodiment

Figure 13:
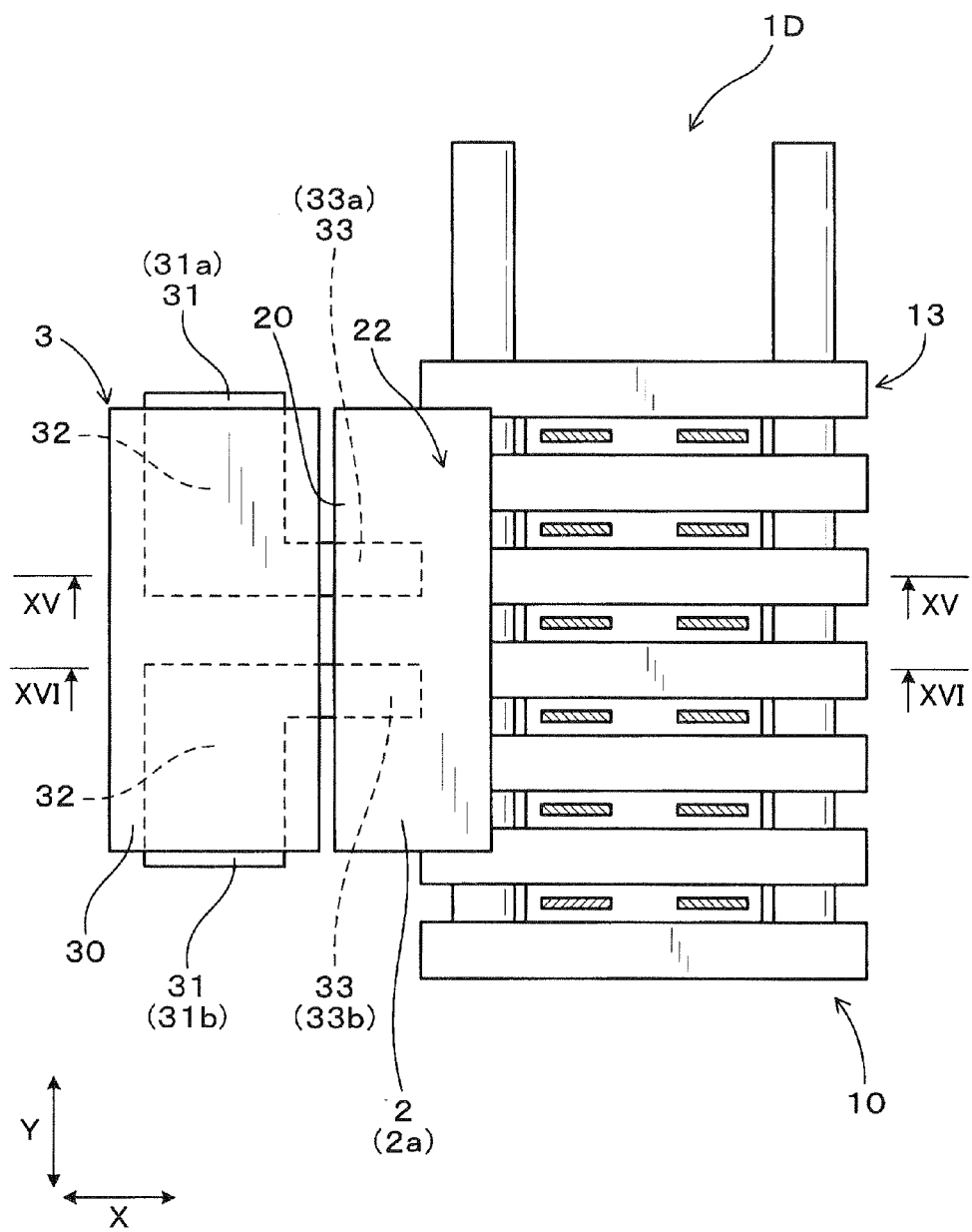
FIG. 13 is a plan view of a power conversion apparatus according to a fourth embodiment of the invention.

Next, a power conversion apparatus 1D according to a fourth embodiment of the invention is described. The fourth embodiment differs from the first embodiment in the orientation of the power module 10. As shown in FIG. 13, in this embodiment, the stacking direction of the stacked body 13 of the power module 10 faces the width direction Y.

Figure 14:
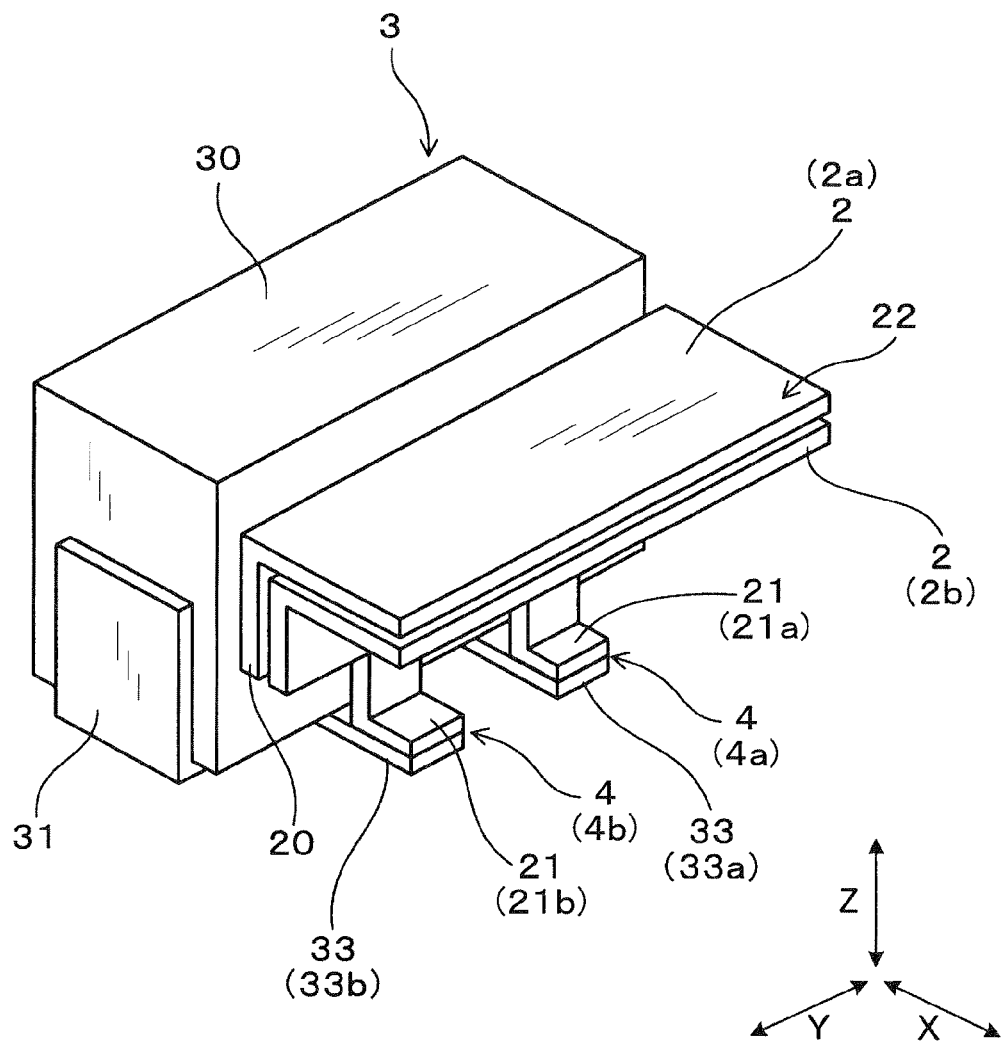
FIG. 14 is a perspective view showing a pair of connecting portions and their vicinity of the power conversion apparatus according to the fourth embodiment of the invention.

In this embodiment, as shown in FIGS. 13 and 14, the DC bus bar 2 is a wide plate-like conductor whose width in the width direction Y is about the same as that of the capacitor 3. Further, as shown in FIG. 14, the DC bus bar 2 is bent in right angle at its approximately center into the first and second parts, the first part being located on the end in the arranging direction X of the power module 10, the second part being located between the power module 10 and the capacitor 3.

As shown in FIGS. 13 and 14, the DC bus bar 2 is disposed such that its thickness direction faces the height direction Z at its one part overlapping with the power module when viewed from the height direction. The power module connecting portion 22 of the DC bus bar 2 is disposed on the side of the power module 10. The end of the other part of the DC bus bar 2 is located on the side of the capacitor 3.

The second part of the DC bus bar 2 extends in the arranging direction X toward the capacitor 3, and is bent to the height direction Z along the capacitor 3 between the power module 10 and the capacitor 3 as shown in FIG. 14. The bus bar 2a of the DC bus bar 2, which is located between the power module 2 and the capacitor and closer to the capacity 3 constitutes the bus bar extension section 20.

The bus bar terminal 21 is formed so as to project to the side opposite to the power module connecting portion 22 in the height direction Z from the end of the DC bus bar 2 located between the power module 10 and the capacitor 3. As shown in FIG. 14, the bus bat terminal 21 is formed by causing its approximately center in the width direction Y to project to the height direction Z (to the side opposite to the power module connecting portion 22), and bending the end of this projected portion in the arranging direction X toward the power module 10 as shown in FIGS. 15 and 16.

As shown in FIG. 14, the capacitor bus bar 31 is formed on the side of the bus bar terminal 21 so as to extend to the height direction Z from the capacitor terminals of the capacitor body 30, and be bent in the width direction Y along the capacitor body 30 to form a bent portion. This bent portion constitutes the capacitor extension section 32 shown in FIG. 13. That is, in this embodiment, the capacitor extension section 32 is located on the side of the bus bar terminal 21 in the height direction Z with respect to the capacitor body 30.

Figure 15:
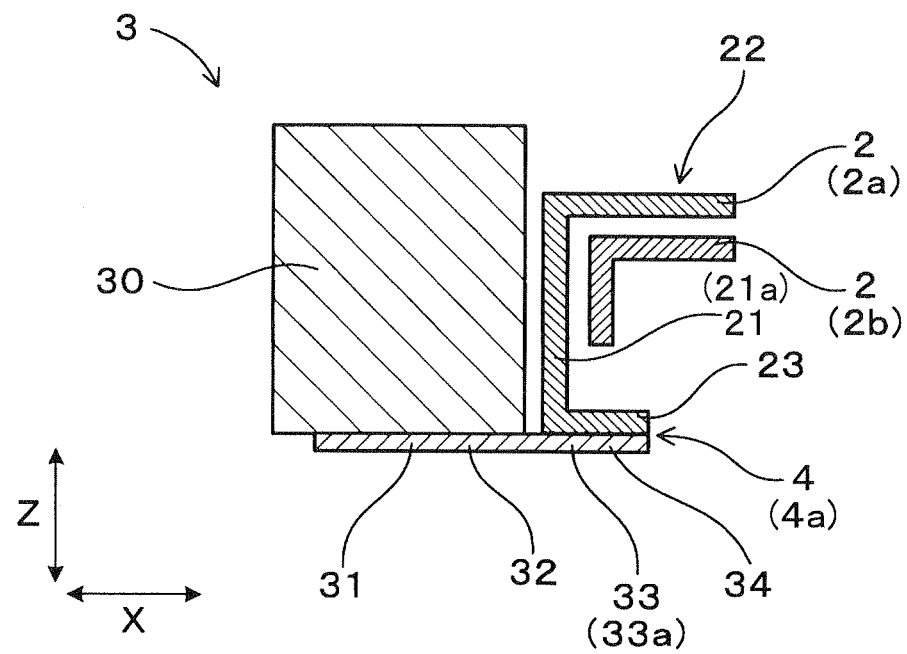
FIG. 15 is a cross-sectional view of FIG. 13 taken along line XV-XV.
Figure 16:
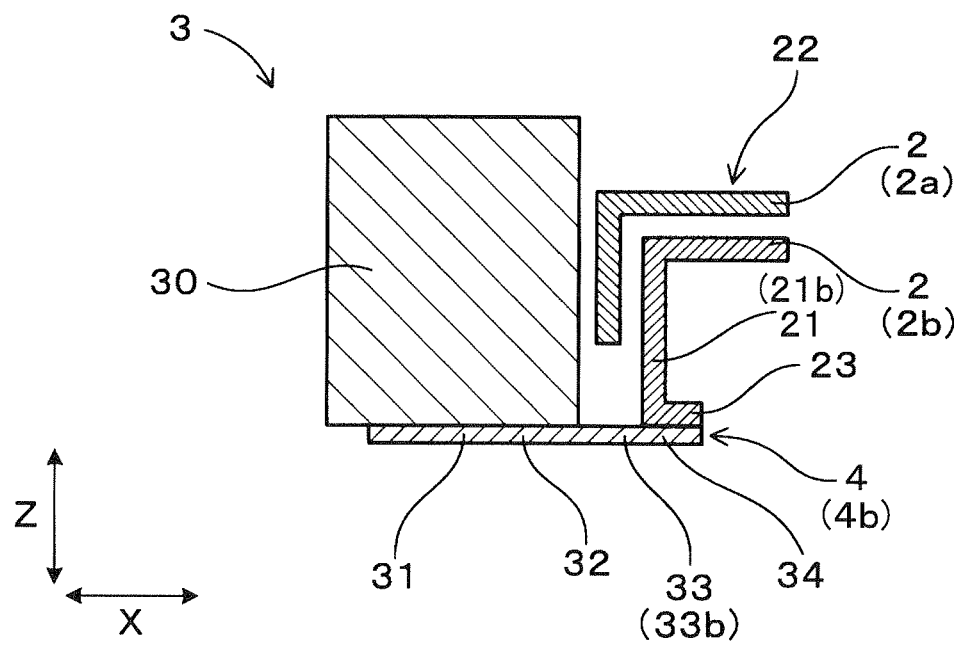
FIG. 16 is a cross-sectional view of FIG. 13 taken along line XVI-XV.

As shown in FIGS. 15 and 16, the capacitor extension section 32 extends in the arranging direction X toward the power module 10, the ends 34 of which constitutes the capacitor terminal 33. The capacitor terminal 33 and the bus bar terminal 21 are stacked on each other in the height direction Z to form the connecting portion 4. Except for the above, the fourth embodiment is the same in structure as the second embodiment.

By disposing the bus bar extension section 20 along the capacitor 3 as described above, the inductance due to the neighboring current paths can be reduced. The directions of the currents flowing respectively through the bus bar extension section 20 and the capacitor extension portion 32 are not limited to any specific direction. They may be parallel or perpendicular to each other. The fourth embodiment provides, in addition to the above advantage, the same advantages as the second embodiment.

Fifth Embodiment

Figure 17:
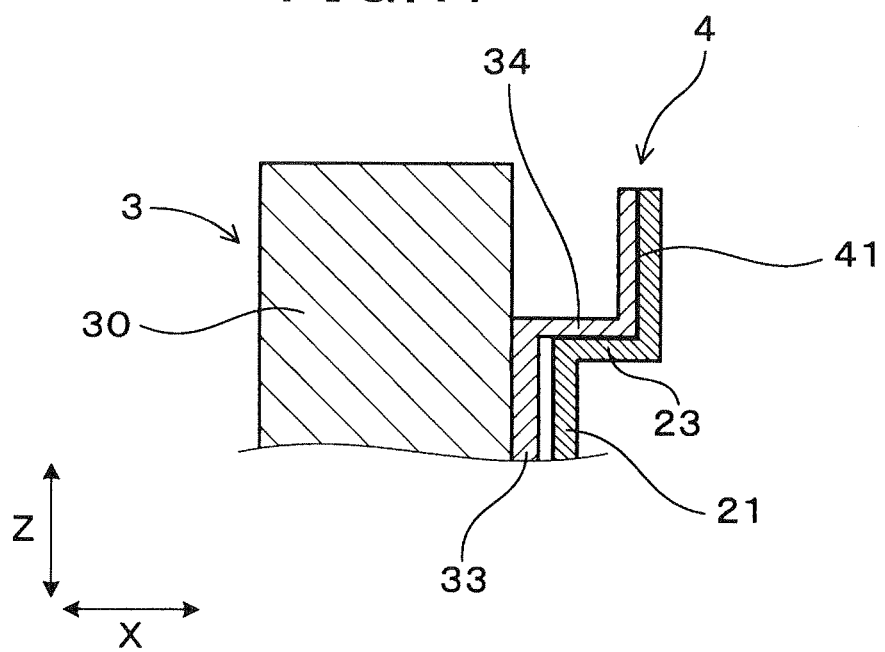
FIG. 17 is a cross-sectional view of a connecting portion of a power conversion apparatus according to a fifth embodiment of the invention.

Next, a fifth embodiment of the invention is described. The fifth embodiment differs from the first embodiment in that the connecting portion 4 is formed with a bent portion 41 facing the capacitor 3. As shown in FIG. 17, the end portion 23 of the bus bar terminal 21 and the end portion 34 of the capacitor terminal 33 formed so as to extend in the arranging direction are bent to the height direction Z at their tips so that the connecting portion 4 is formed with the bent portion 41 bent to the height direction Z. The bent portion 41 thus formed is located along the capacitor 3 as shown in FIG. 17. Except for the above, the fifth embodiment is the same in structure as the first embodiment.

By forming in the connecting portion 4, a portion such as the bent portion 41 which is located along the capacitor 41, the inductance can be further reduced because the current passing through the capacitor 3 and the current passing through the bent portion 41 interact with each other. The fifth embodiment provides, in addition to the above advantage, the same advantages as the first embodiment.

The capacitor 30 has a rectangular shape in the above described first to fifth embodiments. However, the shape of the capacitor 3 is not limited to a rectangular shape. For example, it may have a cylinder shape, or an elliptical cylinder shape. The number of the capacitor body 30 is not limited to one. The capacitor 3 may have a plurality of capacitor bodies connected to one another through the capacitor bus bar 31 or the like.

The above explained preferred embodiments are exemplary of the invention of the present application which is described solely by the claims appended below. It should be understood that modifications of the preferred embodiments may be made as would occur to one of skill in the art.

What is claimed is:
1. A power conversion apparatus comprising:
a power module constituting a switching circuit;
a capacitor electrically connected to the power module; and
a pair of DC bus bars for transferring electric power to and from the power module,
wherein the pair of the DC bus bars includes a bus bar extension section which is located along a surface of the capacitor at least at part of a portion thereof constituting a current path between the power module and the capacitor, the capacitor includes a capacitor body and a pair of capacitor bus bars drawn from a pair of electrodes of the capacitor body and connected to the pair of the DC bus bars, the pair of the capacitor bus bars including a capacitor extension section which is located along the surface of the capacitor between the capacitor and the bus bar extension section, and a principal surface of the capacitor extension section faces a principal surface of the bus bar extension section.

2. The power conversion apparatus according to claim 1, wherein the bus bar extension section and the capacitor extension section are disposed such that direction of a current flowing through the bus bar extension section and direction of a current flowing through the capacitor extension section are opposite to each other.

3. The power conversion apparatus according to claim 1, further comprising a pair of connecting portions for connection between the DC bus bars and the pair of the capacitor bus bars, the pair of the connecting portions including a pair of bus bar terminals provided in the pair of the DC bus bars and a pair of capacitor terminals provided in the pair of the capacitor bus bars, the pair of the bus bar terminals and the pair of the capacitor terminals being connected to each other in a state where the pair of the bus bar terminals and the pair of the capacitor terminals are facing a same direction.

4. The power conversion apparatus according to claim 1, wherein the bus bar extension section and the capacitor extension section are located between the capacitor and the power module.

5. The power conversion apparatus according to claim 1, wherein the bus bar extension section is located adjacent to the capacitor such that each adjacent two of directions of currents respectively flowing through the bus bar extension section, the capacitor extension section and the capacity body are opposite to each other.

6. The power conversion apparatus according to claim 1, wherein the bus bar extension section is located between the capacitor and the power module.

7. The power conversion apparatus according to claim 1, wherein the capacitor body, the capacitor extension section, the bus bar extension section and the power module are arranged in this order.

* * * * *